(12) United States Patent  
Kawamura

(10) Patent No.: US 8,477,524 B2
(45) Date of Patent: Jul. 2, 2013

(54) NONVOLATILE MEMORY DEVICES AND RELATED METHODS AND SYSTEMS

(75) Inventor: Shoichi Kawamura, Yokohama (JP)

(73) Assignee: Samsung Electronics Co., Ltd. (KR)

( * ) Notice: Subject to any disclaimer, the term of this patent is extended or adjusted under 35 U.S.C. 154(b) by 238 days.

(21) Appl. No.: 12/974,809

(22) Filed: Dec. 21, 2010

(65) Prior Publication Data

US 2011/0157960 A1 Jun. 30, 2011

(30) Foreign Application Priority Data

Dec. 25, 2009 (JP) ................................. 2009-294114
Mar. 18, 2010 (KR) ........................ 10-2010-0024119

(51) Int. Cl.
*G11C 11/00* (2006.01)
*G11C 11/16* (2006.01)
*G11C 8/08* (2006.01)

(52) U.S. Cl.
USPC ........ 365/148; 365/175; 365/230.06; 365/51; 257/2

(58) Field of Classification Search
USPC .................... 365/148, 175, 230.06, 51; 257/2
See application file for complete search history.

(56) References Cited

U.S. PATENT DOCUMENTS

| 7,505,344 B2 * | 3/2009 | Scheuerlein ................. 365/206 |
| 2007/0195582 A1 * | 8/2007 | Sakata et al. ................. 365/148 |

FOREIGN PATENT DOCUMENTS

| JP | 2006-514393 A | 4/2006 |
| JP | 2007-165873 | 6/2007 |
| JP | 2009-099814 | 5/2009 |
| JP | 2009-163867 | 7/2009 |
| JP | 2009-177181 | 8/2009 |
| WO | WO 2004/084229 A1 | 9/2004 |

* cited by examiner

*Primary Examiner* — Toan Le
*Assistant Examiner* — Hai Pham
(74) *Attorney, Agent, or Firm* — Myers Bigel Sibley & Sajovec

(57) ABSTRACT

Nonvolatile memory devices are provided including a memory cell array having a plurality of stacked memory layers and a rectifier configured to select memory cells constituting each memory layer sharing a word line or a bit line with another adjacent memory layer. The nonvolatile memory devices including a word line driving unit configured to drive a first word line, connected to a first memory cell of a first memory layer to be read, at a first voltage level and drive a second word line, connected to a second memory cell of a second memory layer sharing a first bit line connected to the first memory cell, at a second voltage level. The nonvolatile memory device further includes a bit line biasing unit configured to bias the first bit line at the second voltage level and bias a second bit line, connected to a third memory cell of a third memory layer sharing the first word line, at the first voltage level. Related methods and systems are also provided herein.

16 Claims, 16 Drawing Sheets

US 8,477,524 B2

NONVOLATILE MEMORY DEVICES AND RELATED METHODS AND SYSTEMS

CLAIM OF PRIORITY

This application claims priority to Japanese Patent Application No. 2009-294114, filed Dec. 25, 2009, and to Korean Patent Application No. 10-2010-0024119, filed Mar. 18, 2010, the contents of which are hereby incorporated herein by reference as if set forth in their entirety.

FIELD

The present inventive concept relates generally to nonvolatile memory devices, and more particularly, to nonvolatile memory devices having three-dimensionally stacked memory cells and related methods and systems.

BACKGROUND

Recently, in order to address the issue of microtechnology in the field of nonvolatile memory devices, extensive research is being conducted to improve the integration density of these memory devices by stacking memory cells in a three-dimensional structure. In particular, active research is being conducted on the stacking of memory cells in the field of new memory devices, such as Phase-change Random Access Memory (PRAM) and Resistive Random Access Memory (RRAM).

In a typical memory cell array, a plurality of word lines and a plurality of bit lines intersect perpendicularly to each other, and memory cells are disposed at the intersections between the word lines and the bit lines. The memory cell at the intersection between the word line and the bit line is selected by an address, and data is read from the selected memory cell through the bit line. Each memory cell has a selector for the memory cell selection.

Examples of the selectors for selection of the stacked memory cells include planar-type metal oxide semiconductor field effect transistors (MOSFETs), macaroni-type MOSFETs, and diodes. The planar-type MOSFETs are not suitable for planar micronization and cannot increase the planar integration density. The macaroni-type MOSFETs are suitable for planar micronization, but typically require a complex fabrication process. Because the diodes have a simple structure, they are suitable for micronization and do not require a complex fabrication. Thus, the diodes are most useful as selectors of stacked memory cells.

FIG. 16 is a circuit diagram illustrating an equivalent circuit of a memory cell array that uses diodes as selectors of stacked memory cells. For the convenience of description, FIG. 16 illustrates only three-layered stacked memory cells MC1, MC2, MC3 and MC12 and bit lines BL1 and BL3 and word lines WL2, WL4 and WL22 connected to the memory cells, while omitting the illustration of other memory cells arranged in the directions of word lines and bit lines.

Each memory cell includes a diode (as a selector) and a resistor with a resistance value corresponding to memory data. The resistor and the memory are connected in series between the word line and the bit line. The diode is connected in the forward bias direction when the bit line has a higher potential than the word line. Furthermore, the word line and the bit line are alternately stacked to be shared by two layers of memory cells that are adjacent to each other.

For example, if data is being read from the second-layer memory cell MC2, the word line WL2 is selectively driven at a low level 0V by a decoder circuit (not illustrated) and the bit line BL3 is selectively biased at a predetermined high level Vsel. In this bias state, a current value is detected by a sense amp (not illustrated) connected to the bit line BL3 and the logic value (0 or 1) of the memory data of the memory cell MC2 is determined from the detection result prior to output to an external device.

If the word line and the bit line are shared between the adjacent layers and a diode is used as a selector of the stacked memory cells, the word line WL2 is selectively driven at the low level and the bit line BL3 is selectively biased at the high level to cause the diode of the memory cell MC2 (i.e., the read target) to be forward biased. On the other hand, if the word line WL2 is driven at the high level and the bit line BL3 is biased at the low level, the diode of the memory cell MC2 is reverse biased. Regardless, if the resistance value of the resistor of the memory cell MC2, a current does not flow from the memory cell MC2 to the bit line BL3. In other words, the memory cell MC2 is unselected and a memory data read operation is not performed.

However, the diode is a 2-terminal device and its conduction state is determined by the voltage relationship between its anode and cathode. Therefore, as described above, if the word line and the bit line are shared between the adjacent layers and the diode is used as the selector of the stacked memory cells, a current may be generated between the word line or bit line of the selected layer and the word line or bit line of the unselected layer according to the voltage states of the bit line and the word line connected to the memory cell of the unselected layer. Thus, power consumption may increase and a normal read operation may be hindered as discussed below with respect to FIG. 16

In the above-described example, in order to read data from the memory cell MC2 of the second layer (i.e., the selected layer), the word line WL2 is driven at the low level 0V and the bit line BL3 is biased at the high level Vsel. If the word line WL4 connected to the memory cell MC3 of the third layer (i.e., the unselected layer) is floated, a charge current IL1 of a parasitic capacitance (not illustrated) of the word line WL4 flows from the bit line BL3 through the memory cell MC3 to the word line WL4. Consequently, the sense amp (not illustrated) connected to the bit line BL3 detects the charge current IL1 flowing through the memory cell MC3 of the unselected layer, in addition to the current flowing through the memory cell MC2 of the selected layer. Thus, a current of the memory cell MC2 of the selected layer cannot be normally detected and a read operation is hindered. Also, power consumption increases because a charge current IL1 of the parasitic capacitance of the word line WL4 is generated.

Furthermore, if the bit line BL1 connected to the memory cell MC1 of the first layer (i.e., the unselected layer) is floated, a leakage current IL2 of another memory cell MC12 of the same layer as the memory cell MC1 flows through the bit line BL1 and the memory cell MC1 to the word line WL2. In particular, not only the selected memory cell MC1, but also the unselected memory cell MC12, are connected to the bit line BL1. The word line WL22 connected to the memory cell MC12 is driven at the high level Vsel. On the current path between the word line WL22 driven at the high level Vsel and the word line WL2 driven at the low level 0V, the diode of the memory cell MC12 is reverse biased and the reverse leakage current IL2 flows through the bit line BL1 and the memory cell MC1 to the word line WL2.

There are a plurality of memory cells on the bit line BL1 that have the same bias state as the memory cell MC12. The total amount of the reverse leakage currents IL2 of the memory cells with such bias state flows from the word line WL22 to the word line WL2. Consequently, the word line WL2 typically cannot maintain the low level and the current flowing to the memory cell MC2 of the selected layer changes, so that the sense amp (not illustrated) connected to the bit line BL3 cannot normally detect the current of the memory cell MC2 of the selected layer. Thus, a detection operation may be hindered.

SUMMARY

Some embodiments of the present inventive concept provide nonvolatile memory devices including a memory cell array having a plurality of stacked memory layers and a rectifier configured to select memory cells constituting each memory layer sharing a word line or a bit line with another adjacent memory layer. The nonvolatile memory devices including a word line driving unit configured to drive a first word line, connected to a first memory cell of a first memory layer to be read, at a first voltage level and drive a second word line, connected to a second memory cell of a second memory layer sharing a first bit line connected to the first memory cell, at a second voltage level. The nonvolatile memory device further includes a bit line biasing unit configured to bias the first bit line at the second voltage level and bias a second bit line, connected to a third memory cell of a third memory layer sharing the first word line, at the first voltage level.

In further embodiments, the memory cell array may include a plurality of blocks each including a plurality of memory layers. The word line driving unit may be further configured to float all word lines of other blocks among the plurality of blocks, except a block of the plurality of blocks that includes the first memory layer to be read. The bit line biasing unit may be further configured to bias all bit lines except the first bit line connected to the memory cell of the first memory layer to be read, at the first voltage level.

In still further embodiments, the rectifier may be a diode. The first voltage level and the second voltage level may forward-bias the diode provided as a selector of the first memory cell of the first memory layer to be read.

In some embodiments, the second voltage level may be higher than the first voltage level.

Further embodiments of the present inventive concept provide methods of reading in a nonvolatile memory device. The nonvolatile memory device includes a memory cell array having a plurality of stacked memory layers each having a first conductive line having a first direction, a second conductive line having a second direction intersecting the first direction, and a memory cell at an intersection between the first conductive line and the second conductive line, and sharing the first or second conductive line with an adjacent memory layer. The method includes selecting a first memory layer; applying a first voltage to a first conductive line of the selected first memory layer; applying a second voltage to a second conductive line of the selected first memory layer; and applying the second voltage to a first conductive line of a second memory layer sharing the second conductive line with the selected first memory layer.

In still further embodiments, the second voltage may be higher than the first voltage.

In some embodiments, the memory cell may include a diode and the second voltage and the first voltage may forward-bias the diode.

In further embodiments, the method further includes applying the first voltage to a second conductive line of a third memory layer sharing the first conductive line with the selected first memory layer.

In still further embodiments, the plurality of stacked memory layers are divided into a plurality of memory blocks, and the method further includes floating word lines of an unselected memory block.

Some embodiments of the present inventive concept provide memory systems including a nonvolatile memory device and a controller configured to control the nonvolatile memory device. The nonvolatile memory device includes a memory cell array including a plurality of stacked memory layers each having a first conductive line having a first direction, a second conductive line of having a second direction, different from and intersecting the first direction, and a memory cell at the intersection between the first conductive line and the second conductive line, and sharing the first or second conductive line with an adjacent memory layer; a first selection circuit configured to apply a first voltage to a first conductive line of a selected first memory layer and apply a second voltage to a first conductive line of a second memory layer sharing the second conductive line with the selected first memory layer; and a second selection circuit configured to apply the second voltage to a second conductive line of the selected first memory layer.

In further embodiments, the second selection circuit may be further configured to apply the first voltage to a second conductive line of a third memory layer sharing the first conductive line with the selected first memory layer.

In still further embodiments, the first voltage may be a ground voltage and the second voltage may be a positive voltage.

In some embodiments, the nonvolatile memory device and the controller may constitute a memory card.

In further embodiments, the nonvolatile memory device and the controller may constitute a solid state drive.

BRIEF DESCRIPTION OF THE DRAWINGS

The accompanying drawings are included to provide a further understanding of the present inventive concept, and are incorporated in and constitute a part of this specification. The drawings illustrate exemplary embodiments of the present inventive concept and, together with the description, serve to explain principles of the inventive concept. In the drawings.

DETAILED DESCRIPTION OF THE EMBODIMENTS

Figure 1:
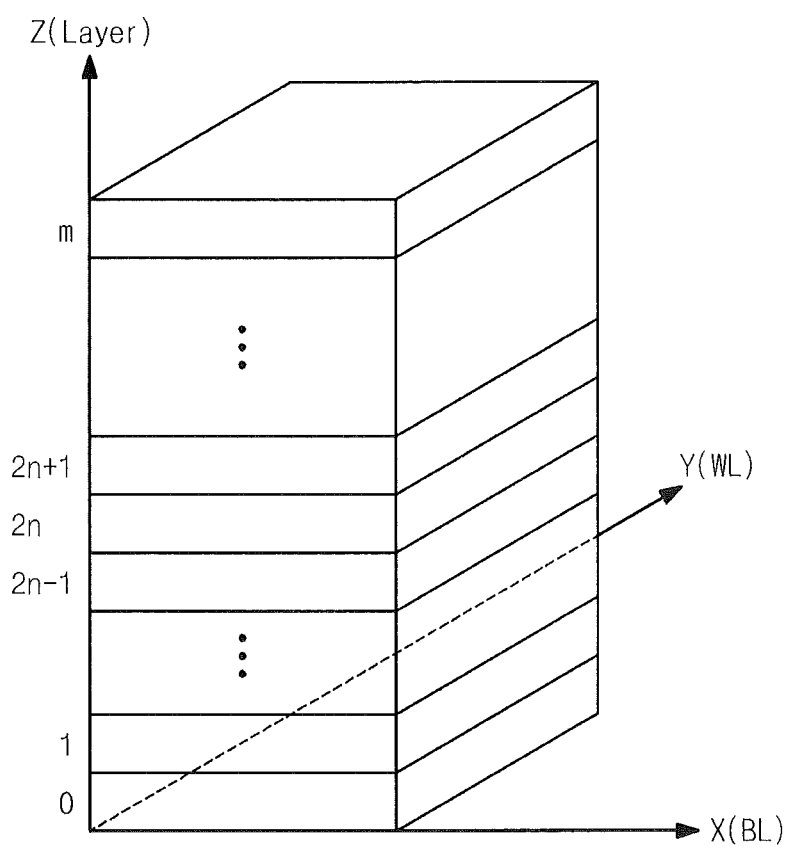
FIG. 1 is a block diagram illustrating an exemplary structure of memory cell arrays according to some embodiments of the inventive concept.

The inventive concept now will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Some embodiments are described herein with reference to flowcharts illustrating operations of various aspects of the present inventive concept. It should be noted that in other implementations, the functions noted in the Blocks may occur out of the order noted in flowchart. For example, two Blocks shown in succession may, in fact, be executed substantially concurrently, or the Blocks may be sometimes executed in the reverse order, depending on the functionality involved.

Some embodiments of the inventive concept provide nonvolatile memory devices that use rectifiers, for example, diodes, as units for selecting stacked memory cells sharing word lines and bit lines, and can stably detect the current of a read target memory cell while suppressing the power consumption of unselected memory cells in a read operation as will be discussed further below with respect to FIGS. 1 through 15.

Referring first to FIG. 1, a block diagram illustrating an exemplary structure of memory cell arrays of a nonvolatile memory device according to some embodiments of the inventive concept will be discussed. As illustrated in FIG. 1, the memory cell array has a three-dimensional structure and includes two-dimensional memory cell arrays (hereinafter referred to as a memory layer) stacked on the XY plane in the Z-axis direction. In embodiments illustrated in FIG. 1, the memory cell array includes (m+1) memory layers from the bottom memory layer 0 up to the top memory layer m (m: an integer greater than or equal to 1). A bit line BL is arranged in the X-axis direction, a word line WL is arranged in the Y-axis direction, and the memory layers 0~m are stacked in the Z-axis direction.

Figure 2:
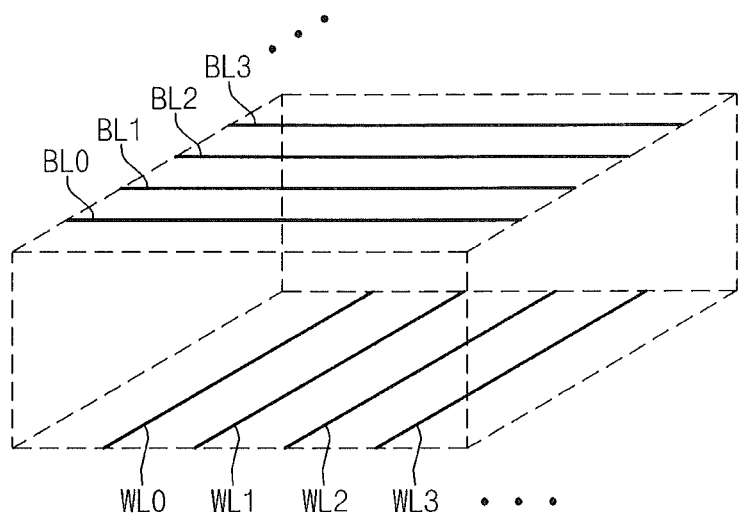
FIG. 2 is a diagram illustrating the relationship between a memory layer, word lines and bit lines according to some embodiments of the inventive concept.

Referring now to FIG. 2, a block diagram illustrating the relationship between bit lines and word lines of each memory layer in accordance with some embodiments of the inventive concept will be discussed. As illustrated in FIG. 2, a plurality of word lines WL0, WL1, WL2, WL3, . . . and a plurality of bit lines BL0, BL1, BL2, BL3, . . . are disposed respectively at the bottom surface and the top surface of each memory layer such that they are perpendicular to each other when projected on the XY plane. If the memory layer of FIG. 2 is the even memory layer 2n (n: an integer greater than or equal to 0 and smaller than or equal to m) of FIG. 1, the word lines WL0, WL1, WL2, WL3, are shared by the memory layer 2n and the lower memory layer 2n−1 and the bit lines BL0, BL1, BL2, BL3, are shared by the memory layer 2n and the upper memory layer 2n+1. Thus, the word lines and the bit lines are arranged alternately in the memory layer stacking direction (i.e., the Z-axis direction).

In some embodiments of the inventive concept, word lines are arranged at the bottom surface of the even memory layer and bit lines are arranged at the bottom surface of the odd memory layer. Thus, word lines (not illustrated) are arranged at the bottom surface of the bottom memory layer 0. However, it will be understood that embodiments of the inventive concept is not limited to this configuration. For example, bit lines may be arranged at the bottom surface of the even memory layer and word lines may be arranged at the bottom surface of the odd memory layer without departing from the scope of the inventive concept.

Figure 3:
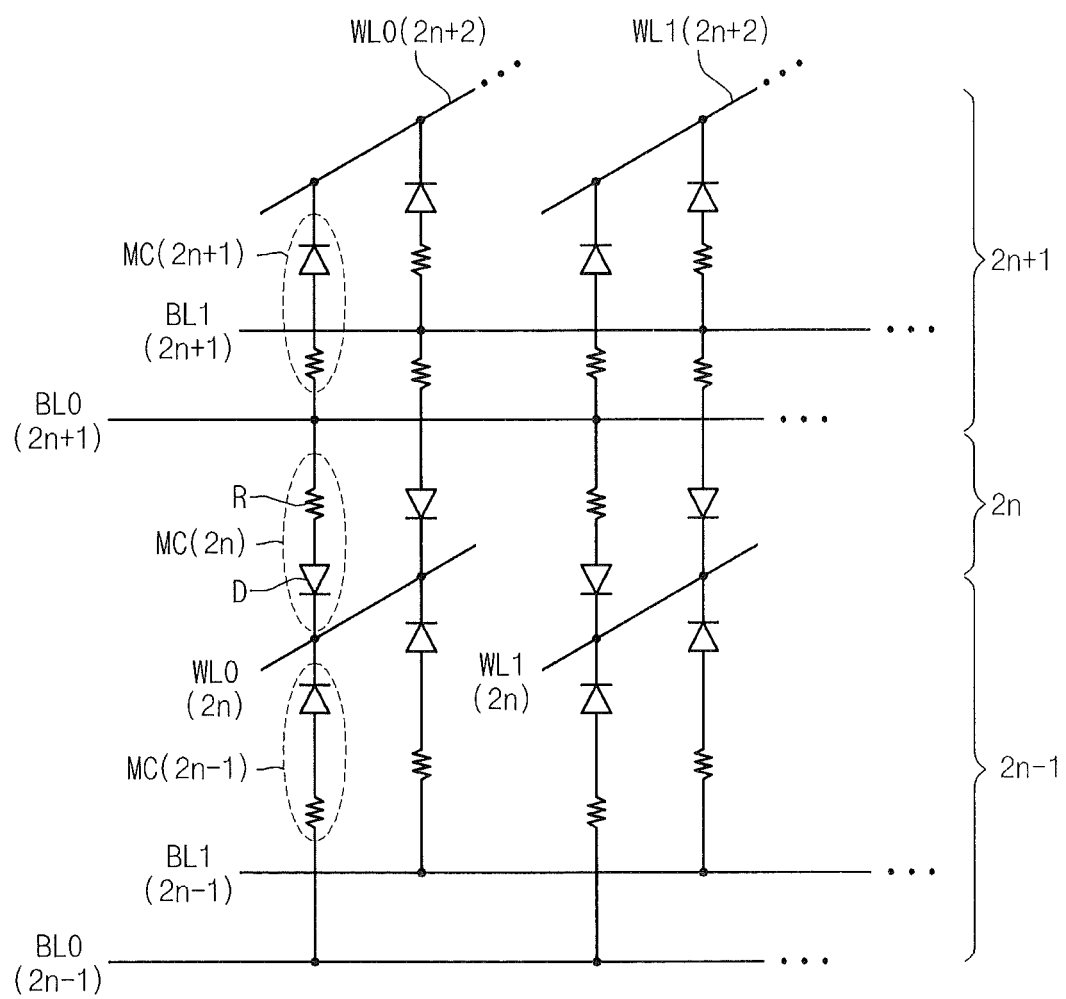
FIG. 3 is a circuit diagram illustrating the connection between bit lines, word lines and memory cells in a memory cell array according to some embodiments of the inventive concept.

Referring now to FIG. 3, a circuit diagram illustrating the connection between bit lines BL, word lines WL and memory cells MC in the memory layers 2n−1, 2n and 2n+1 of FIG. 2 will be discussed. In the following description, if necessary, the layer number of the memory layer including each element is placed in a parenthesis "( )" and added to the end of a symbol denoting the element. For example, in some embodiments of FIG. 3, 'memory cell MC(2n)' denotes a memory cell included in the memory layer 2n. Furthermore, for the convenience of description, word lines and bit lines shared by two memory layers are treated as being located at the bottom surface of each memory layer. The layer number of the memory layer is placed in parentheses and added to the end of a symbol denoting each of word lines and bit lines. For example, embodiments illustrated in FIG. 3, 'word line WL0 (2n)' denotes a word line located at the bottom surface of the memory layer 2n. Similarly, 'bit line BL0(2n+1)' denotes a bit line located at the bottom surface of the memory layer 2n+1.

However, such symbol denotation is merely for the convenience of description. For example, the word lines and bit lines may be treated as being located at the top surface of each memory layer, or may be irrelevant to each memory layer. For example, the word line WL0(2n) is located at the bottom surface of the memory layer 2n, but is located at the top surface of the memory layer 2n−1 in other terms. Likewise, the bit line BL0(2n+1) is located at the bottom surface of the memory layer 2n+1, but is located at the top surface of the memory layer 2n in other terms.

In the structure corresponding to the memory layer 2n of FIG. 3, the memory cell MC(2n) indisposed at the intersection between the word line WL0(2n) and the bit line BL0(2n+1). The memory cell MC(2n) includes a resistor R (a memory cell body) having a resistance value corresponding to memory data and a rectifier D serving as a selector. The resistor R and the rectifier D are connected in series between the word line WL0(2n) and the bit line BL0(2n+1).

For example, the rectifier D is a diode that has an anode connected through the resistor R to the bit line BL0(2n+1) and a cathode connected to the word line WL0(2n). In other words, the rectifier D is forward biased in the memory cell MC(2n) if the bit line BL0(2n+1) is biased at a high level and the word line WL0(2n) is driven at a low level.

In the structure corresponding to the memory layer 2n+1 (i.e., the upper memory layer on the memory layer 2n), the memory cell MC(2n+1) is connected between the bit line BL0(2n+1) connected to the memory cell MC(2n) of the memory layer 2n and the word line WL0(2n+2) located at the top surface of the memory layer 2n+1. In other words, the memory cell MC(2n) of the memory layer 2n and the memory cell MC(2n+1) of the memory layer 2n+1 share the bit line BL0(2n+1). The rectifier D is forward biased in the memory cell MC(2n+1) if the bit line BL0(2n+1) is biased at a high level and the word line WL0(2n+2) is driven at a low level.

In the structure corresponding to the memory layer 2n−1 (i.e., the lower memory layer under the memory layer 2n), the memory cell MC(2n−1) is connected between the word line WL0(2n) connected to the memory cell MC(2n) of the memory layer 2n and the bit line BL0(2n−1) located at the bottom surface of the memory layer 2n−1. In other words, the memory cell MC(2n) of the memory layer 2n and the memory cell MC(2n−1) of the memory layer 2n−1 share the word line WL0(2n). The rectifier D is forward biased in the memory cell MC(2n−1) if the bit line BL0(2n−1) is biased at a high level and the word line WL0(2n) is driven at a low level.

FIG. 3 illustrates the connections between the bit lines, the word lines and the memory cells in the memory layers 2n−1, 2n and 2n+1. The same memory cell is disposed at the intersection between the bit line and the word line of each memory layer. According to some embodiments of the inventive concept, the memory cell array has a three-dimensional structure that shares word lines or bit lines between adjacent memory layers.

Figure 4:
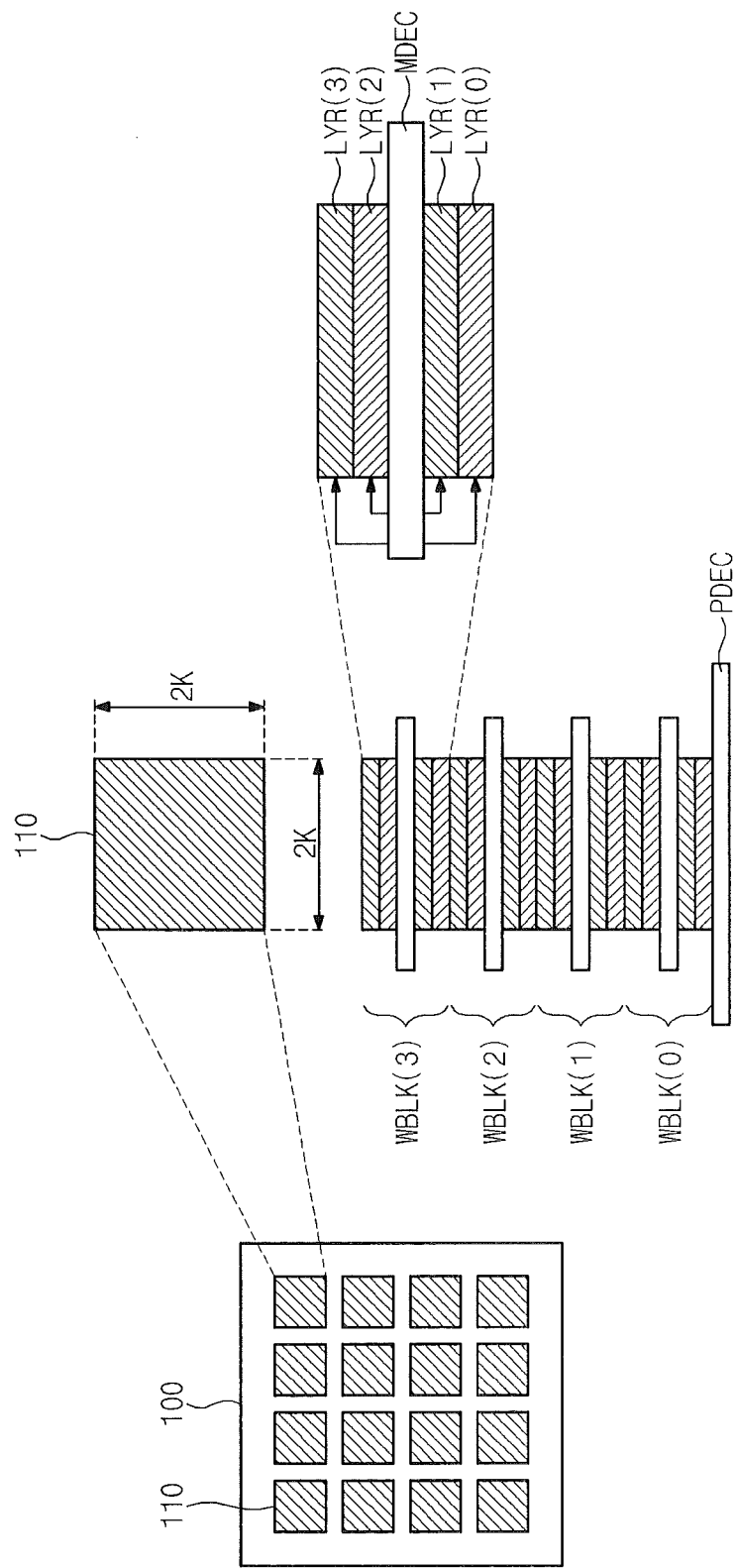
FIG. 4 illustrates is a diagram illustrating the bank structure of a nonvolatile memory cell array according to some embodiments of the inventive concept.

FIG. 4 is a plan view of a nonvolatile memory device 100 using a block division and a bank structure corresponding to the above-described three-dimensional memory cell array. In the following description, if necessary, the number of each block (vertical block) is placed in a parenthesis "< >" and added to the end of a symbol denoting the block (vertical block).

Referring now to FIG. 4, the nonvolatile memory device 100 includes 4×4 banks 110. Each of the banks 110 includes 4 vertical blocks VBLK<0>~VBLK<3>. Each of the vertical blocks includes 4 memory layers LYR(0)~LYR(3) and a selection circuit MDEC. Each of the memory layers includes memory cells arranged in a 2048×2048 matrix format. In other words, in some embodiments, each bank includes 16 memory layers and the 16 memory layers are divided into 4 vertical blocks VBLK<0>~VBLK<3>. The selection circuit MDEC of each vertical block includes a bit line selection circuit selecting each bit line and a word line selection circuit selecting each word line illustrated in FIG. 3 as will be discussed in more detail below.

The bottom layer of the bank 110 includes a preselection circuit PDEC generating a signal provided in common to the selection circuit MDEC of each vertical block. As an example, the preselection circuit PDEC includes a bit line preselection circuit generating a signal provided to the bit line selection circuit.

In embodiments illustrated in FIG. 4, each bank is divided into 4 vertical blocks VBLK<0>~VBLK<3>, but the number of the vertical blocks is random. Furthermore, the bank may have the basic structure of the memory cell array of FIG. 1 without being divided into blocks.

Figure 5:
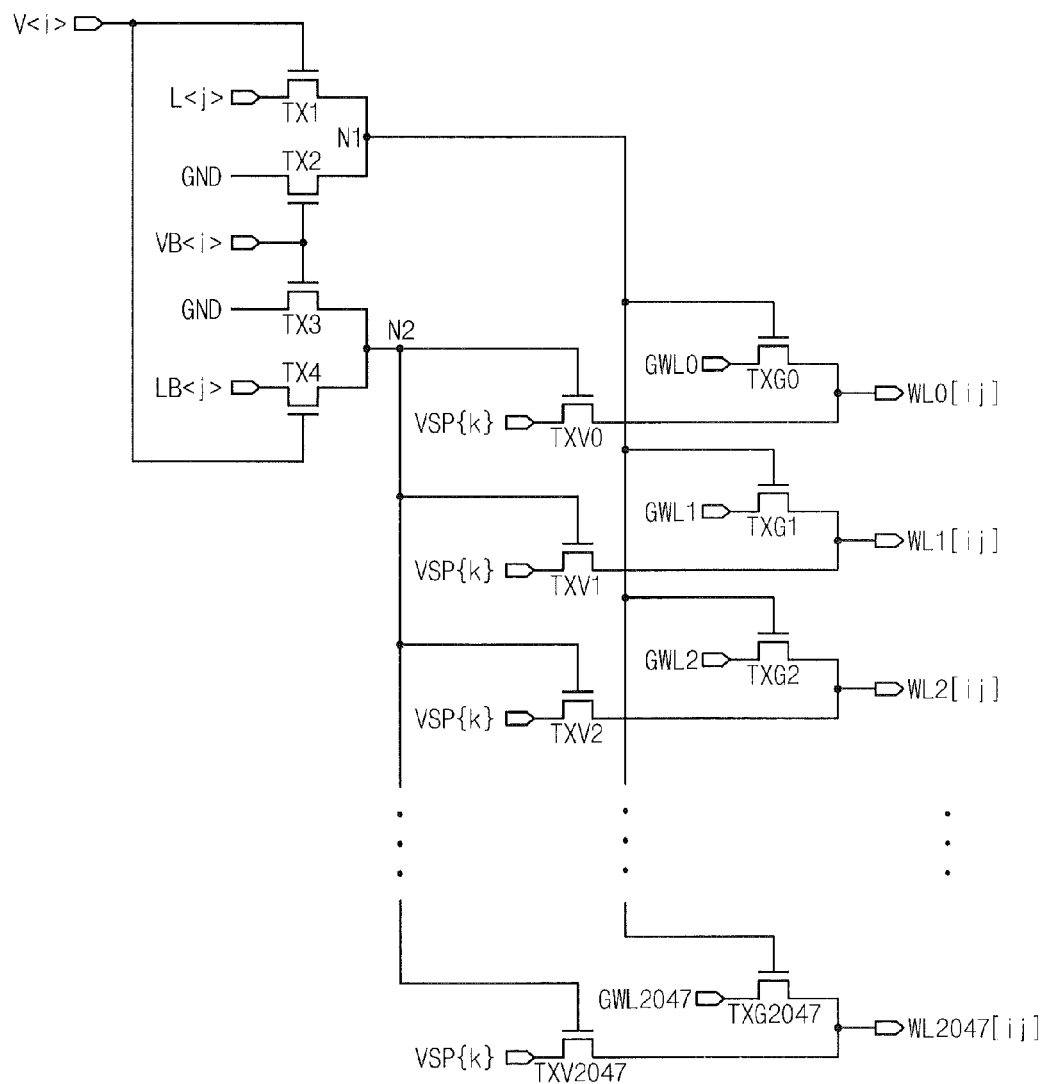
FIG. 5 is a diagram illustrating the structure of a word line selection circuit according to some embodiments of the inventive concept.

FIG. 5 is a diagram illustrating a structure of the word line selection circuit (word line driving unit) in the selection circuit MDEC. The word line selection circuit is included in the selection circuit MDEC of FIG. 4. A vertical block selection signal V<i> for selecting the vertical blocks VBLK<0>~VBLK<3> of FIG. 4 is provided to the gate of an NMOS transistor TX1. A memory layer selection signal L<j> for selecting the memory layers LYR(0)~LYR(3) of FIG. 4 is provided to one end (source or drain) of the current path of the NMOS transistor TX1, and the other end is connected to a node N1. Herein, a variable 'i' denotes the number of a vertical block to be selected. For example, V(0) denotes a signal for selecting the vertical block VBLK<0>. Furthermore, a variable 'j' denotes the number of a memory layer to be selected. For example, L(0) denotes a signal for selecting the memory layer LYR(0).

layer is an unselected memory layer adjacent to a selected memory layer as will be discussed below with reference to Table 1. The other ends (another group of sources and drains) of the current paths of the NMOS transistors TXV0~TXV2047 are connected to the word lines WL0[ij]~WL2047[ij]. Table 1 shows the values (voltage levels) of the respective signals of the word line selection circuit.

TABLE 1

|  |  |  | V<i> | VB<i> | L<j> | LB<j> | VSP{k} | Selected GWL | Unselected GWL | Selected GWL | Unselected GWL |
|---|---|---|---|---|---|---|---|---|---|---|---|
| Selected Bank | Selected Vertical Block | Selected Memory Layer | VHH | GND | VH | GND | Vsel | GND | Vsel | GND | Vsel |
|  |  | Memory Layer sharing BL with Selected Memory Layer | VHH | GND | GND | VH | Vsel | GND | Vsel |  | (all) Vsel |
|  |  | Memory Layer not sharing BL with Selected Memory Layer | VHH | GND | GND | VH | GND | GND | Vsel |  | (all) GND |
|  | Unselected Vertical Block | Memory Layer | GND | VHH | VH or GND | GND or VH | Vsel or GND | GND | Vsel |  | (all) Float |
| Unselected Bank |  |  | VHH or GND | GND or VHH | GND | VH | GND | (all) Vsel |  | (all) GND or Float |  |

An inversion signal VB<i> of the vertical block selection signal V<i> is provided to the gate of an NMOS transistor TX2. One end (source) of the current path of the NMOS transistor TX2 is connected to a ground level GND, and the other end (drain) is connected to the node N1. The inversion signal VB<i> is provided to the gate of an NMOS transistor TX3. One end (source) of the current path of the NMOS transistor TX3 is connected to the ground level GND, and the other end (drain) is connected to a node N2. The vertical block selection signal V<i> is provided to the gate of an NMOS transistor TX4. An inversion signal LB<j> of the memory layer selection signal L<j> is provided to one end (source or drain) of the current path of the NMOS transistor TX4, and the other end is connected to the node N2.

The gates of NMOS transistors TXG0~TXG2047 are connected to the node N1. Global word line selection signals GWL0~GWL2047 are provided respectively to the respective ends of current paths (a group of sources and drains). The global word line selection signals GWL0~GWL2047 are provided in common to all the memory layers, regardless of memory layers and vertical blocks. However, the global word line selection signals GWL0~GWL2047 are meaningful only in a selected memory layer and are selectively set to a low level 0V on the basis of an external address signal. The other ends (another group of sources and drains) of the current paths of the NMOS transistors TXG0~TXG2047 are connected to word lines WL0[ij]~WL2047[ij]. Herein, the variable [ij] added to the end of the symbol of a word line represents the number 'i' of the vertical block and the number 'j' of the memory layer including the word line. If the variable 'i' is not considered in the word line symbol denotation (i.e., block division is not considered) and the variable 'j' is 2n, the word lines WL0[ij]~WL2047[ij] of FIG. 5 correspond to the word lines WL(2n), WL1(2n), . . . of FIG. 3.

The gates of NMOS transistors TXV0~TXV2047 are connected to the node N2. A signal VSP{k} is provided in common to the ends (a group of sources and drains) of the current paths of the NMOS transistors TXV0~TXV2047. The signal VSP{k} is meaningful in an unselected memory layer and has a different voltage level according to whether the memory As shown in Table 1, the word line selection circuit divides a selected bank and an unselected bank and sets each signal value (voltage level) to float or drive all the word lines (i.e., unselected word lines) of the unselected bank at a low level 0V (i.e., a ground level GND). In the selected bank, the word line selection circuit divides a selected vertical block and an unselected vertical block and sets each signal value (voltage level) to float all the word lines (i.e., unselected word lines) of the memory layer of the unselected vertical block.

In the selected vertical block, the word line selection circuit divides a selected memory layer, a memory layer sharing a bit line with the selected memory layer, and a memory layer not sharing a word line with the selected memory layer, and drives each word line selectively. In other words, in the selected memory layer, only the selected word lines are selectively driven at a low level 0V (i.e., a ground level GND) and the unselected word lines are driven at a predetermined high level Vsel.

Like the word lines of the selected memory layer, all the word lines of the memory layer sharing a bit line with the selected memory layer are driven at a high level Vsel. Furthermore, all the word lines of the memory layer not sharing a bit line with the selected memory layer are driven at a low level 0V (i.e., a ground level GND).

A description of the signal VSP{k} in Table 1 is supplemented below. In the denotation of the signal VSP{k}, when the variable T is 0 or 1, the variable 'k' is set to 0; and when the variable 'j' is 2 or 3, the variable 'k' is set to 1. In other words, the signal VSP{0} is set in the memory layers LYR(0) and LYR(1) located at the bottom layer (j is 0 or 1) of the preselection circuit PDEC, and the signal VSP{1} is set in the memory layers LYR(2) and LYR(3) located at the top layer (j is 2 or 3) of the preselection circuit PDEC. The voltage levels of the signal VSP{0} and the signal VSP{1} are set complementarily. For example, if the signal VSP{0} of the memory layers LYR(0) and LYR(1) is set to a high level (i.e., a predetermined voltage level Vsel), the signal VSP{1} of the memory layers LYR(2) and LYR(3) is set to a low level (i.e., a ground level GND). On the other hand, if the signal VSP{0} of the memory layers LYR(0) and LYR(1) is set to a low level (i.e., a ground level GND), the signal VSP{1} of the memory layers LYR(2) and LYR(3) is set to a high level (i.e., a predetermined voltage level Vsel).

This operation of the signal VSP{k} is represented in Table 1 by the value Vsel of the item of the memory layer sharing the bit line BL with the selected memory layer and the value GND of the item of the memory layer not sharing the bit line BL with the selected memory layer. By the signal VSP{k}, the word lines of the layers not sharing the word line with the selected memory layer among the 4 memory layers in the selected vertical block are set to the ground level GND. Accordingly, the generation of a leakage current of the memory layer not sharing the word line with the selected memory layer is suppressed. Setting the voltage level of the word lines selectively according to whether it share the word lines with the selected vertical block reduces the likelihood or possible prevents the generation of a leakage current between the respective memory layers, thus enabling possible power consumption reduction and malfunction prevention.

Because word lines are shared at a contact portion between the selected vertical block and the unselected vertical block (the boundary between the bottom memory layer 0 of the vertical block of the upper layer and the top memory layer 3 of the vertical block of the lower layer), the word lines are connected to the word line selection circuit of the vertical blocks of both sides. However, as shown in the item of the memory layer of the unselected vertical block, the unselected word lines are all floated. Specifically, a switch of the word line selection circuit of the unselected vertical block is set to an off state. Thus, the word lines located at the boundary are not simultaneously driven by the word line selection circuit of the memory layer of both sides.

Figure 6:
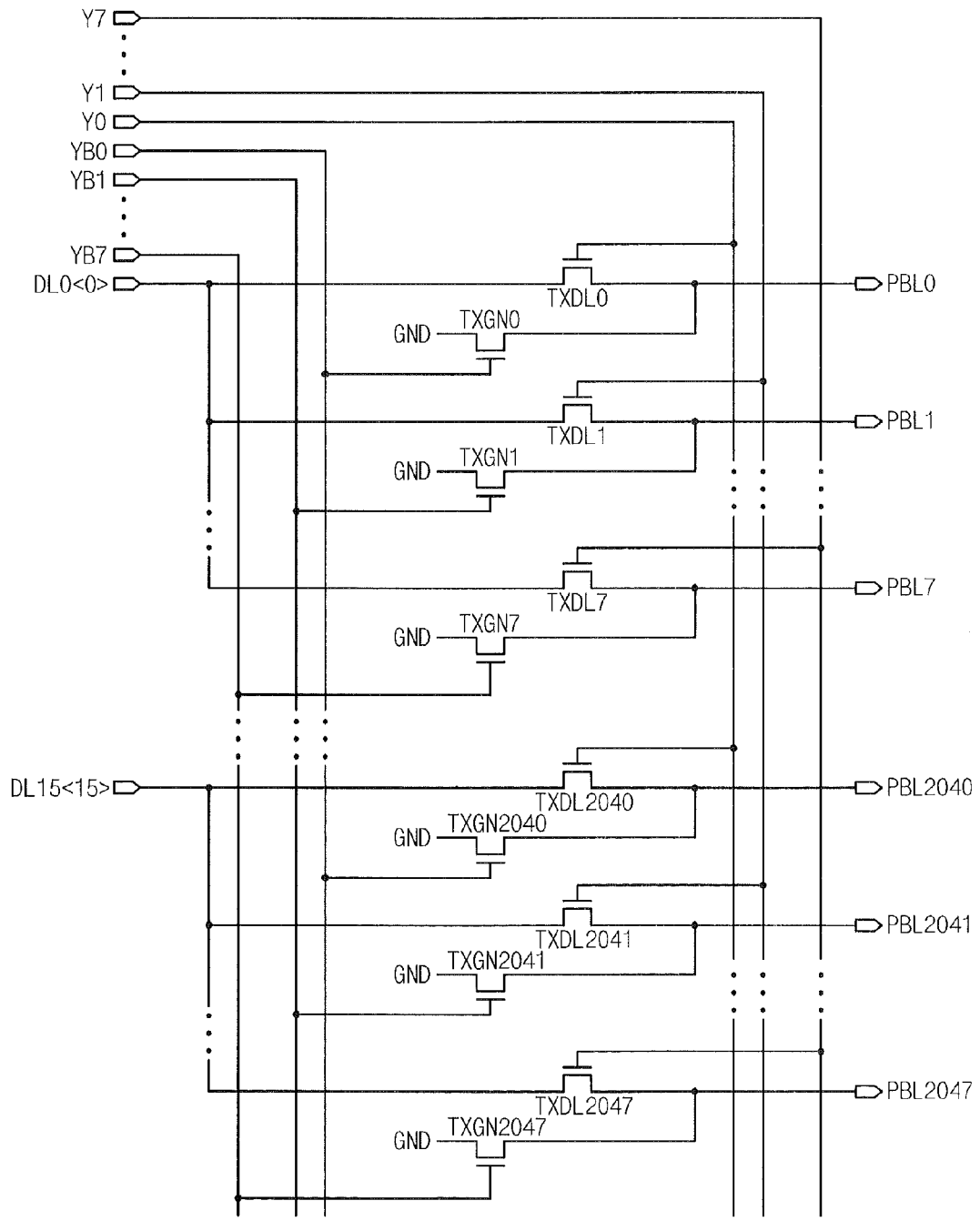
FIG. 6 is a diagram illustrating the structure of a bit line preselection circuit according to some embodiments of the inventive concept.
Figure 7:
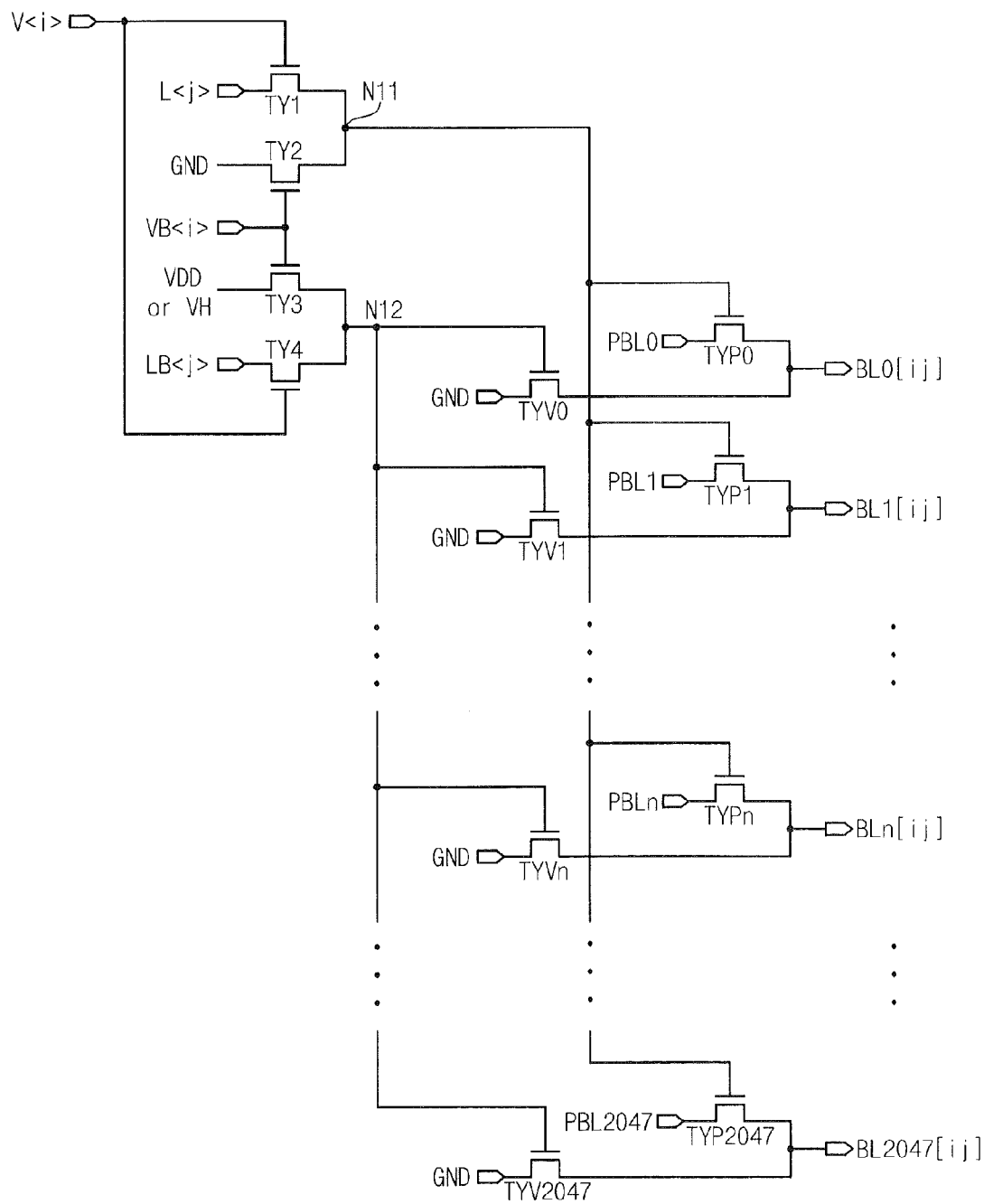
FIG. 7 is a diagram illustrating the structure of a bit line selection circuit according to some embodiments of the inventive concept.

FIGS. 6 and 7 are diagrams illustrating a structure of the bit line selection circuit (bit line biasing unit) in accordance with some embodiments of the inventive concept. FIG. 6 is a diagram illustrating the structure of a bit line preselection circuit generating the pre bit line signals PBL0~PBL2047 provided in common to the vertical blocks VBLK<0>~VBLK<3> of the bit line selection circuit.

In particular, the bit line selection circuit selects a bit line represented by data to be output to an external device, and selectively sets a bias corresponding to the bit line. In other words, a sense amp (not illustrated) is connected to the selected bit line and a predetermined voltage level Vsel is biased by the sense amp. However, the bit line biasing unit is not limited to embodiments illustrated in FIG. 6.

A structure of the bit line preselection circuit will now be discussed with respect to FIG. 6. The bit line preselection circuit is included in the preselection circuit PDEC of FIG. 4. In the following description, the numerals of data lines DL<0>~DL<15> represent the numbers 0~15 of input/output (I/O) terminals and are different from the number representing the vertical block number <i>.

An address signal Y0 is provided to the gate of an NMOS transistor TXDL0, and a global data line signal DL0<0> is provided to one end (source or drain) of the current path. Also, an inversion signal YB0 of the address signal Y0 is provided to the gate of an NMOS transistor TXGN0, one end (source) of the current path is connected to a ground level GND, and the other end is connected to the other end (source or drain) of the current path of the NMOS transistor TXDL0. A signal representing a connection node (no symbol) becomes a pre bit line signal PBL0.

Likewise, NMOS transistors TXDL1~TXDL7 and NMOS transistors TXGN1~TXGN7, to which address signals Y1~Y7, their inversion signals YB1~YB7, and the data line signal DL0<0> are provided, constitute a circuit corresponding to pre bit line signals PBL1~PBL7. Circuits generating the pre bit line signals PBL0~PBL7 constitute one circuit group, thus providing a total of 256 circuit groups corresponding to pre bit line signals PBL0~PBL2047.

The pre bit line signals PBL0~PBL2047 correspond to 2048 bit lines BL0~BL2047 of each memory layer. By the address signals Y0~Y7 and their inversion signals YB0~YB7, the 256 pre bit line signals (⅛ of all the pre bit line signals) among the pre bit line signals PBL0~PBL2047 become selected 256 data line signals DL0<0>~DL15<15>. The 256 data line signals DL0<0>~DL15<15> are divided by a multiplexer (not illustrated) into 16 pages, and 16 I/O terminals are allocated to each page. Table 2 shows the values (voltage levels) of the respective signals of the bit line preselection circuit.

TABLE 2

|  | Selected Y<i> | Unselected Y<i> | Selected YB<i> | Unselected YB<i> | Selected PBL | Unselected PBL |
|---|---|---|---|---|---|---|
| Selected Bank | VH | GND | GND | VH | Vsel | GND |
| Unselected Bank | GND | GND | VH | VH |  | (all) GND |

As shown in Table 2, the bit line preselection circuit divides a selected bank and an unselected bank and sets each signal value (voltage level) to bias all the bit lines of the unselected bank at a low level 0 v. In the selected bank, the bit line preselection circuit sets each signal value (voltage level) to bias the selected pre bit line PBL at a high level of a predetermined voltage level Vsel and bias the unselected other pre bit lines PBL at a low level 0V of a ground level GND. In summary, the selected pre bit line of the selected bank is biased at a high level and other pre bit lines are all driven at a low level.

FIG. 7 is a diagram illustrating the structure of a bit line main selection circuit generating the signals provided respectively to the vertical blocks VBLK<0>~VBLK<3> of the bit line selection circuit in accordance with some embodiments of the inventive concept. The bit line main selection circuit is included in the selection circuit MDEC of FIG. 4. A vertical block selection signal V<i> for selecting the vertical blocks VBLK<0>~VBLK<3> is provided to the gate of an NMOS transistor TY1. A memory layer selection signal L<j> for selecting the memory layers LYR(0)~LYR(3) is provided to one end (source or drain) of the current path of the NMOS transistor TY1, and the other end is connected to a node N11.

An inversion signal VB<i> of the vertical block selection signal V<i> is provided to the gate of an NMOS transistor TY2. One end (source) of the current path of the NMOS transistor TY2 is connected to a ground level GND, and the other end (drain) is connected to the node N11. The inversion signal VB<i> is provided to the gate of an NMOS transistor TY3. A power supply voltage VDD or a predetermined high voltage VH is provided to one end (source or drain) of the current path of the NMOS transistor TY3, and the other end (drain) is connected to a node N12. The vertical block selection signal V<i> is provided to the gate of an NMOS transistor TY4. An inversion signal LB<j> of the memory layer selection signal L<j> is provided to one end (source or drain) of the current path of the NMOS transistor TY4, and the other end is connected to the node N12.

The gates of NMOS transistors TYP0~TYP2047 are connected to the node N11, and the pre bit line signals PBL0~PBL2047 of FIG. 6 are provided respectively to the respective ends of their current paths (a group of sources and drains). The pre bit line signals PBL0~PBL2047 are provided in common to all the memory layers, regardless of vertical blocks. The other ends (another group of sources and drains) of the current paths of the NMOS transistors TYP0~TYP2047 are connected to bit lines BL0[ij]~BL2047[ij]. The variable [ij] added to the end of the symbol of a bit line represents the number 'i' of the vertical block and the number 'j' of the memory layer including the bit line. If the variable 'i' is not considered (i.e., block division is not considered) and the variable is 2n+1, the bit lines BL0[ij]~BL2047[ij] correspond to the bit lines BL0(2n+1), BL1(2n+1), located at the bottom surface of the memory layer 2n+1 of FIG. 3.

Figure 9:
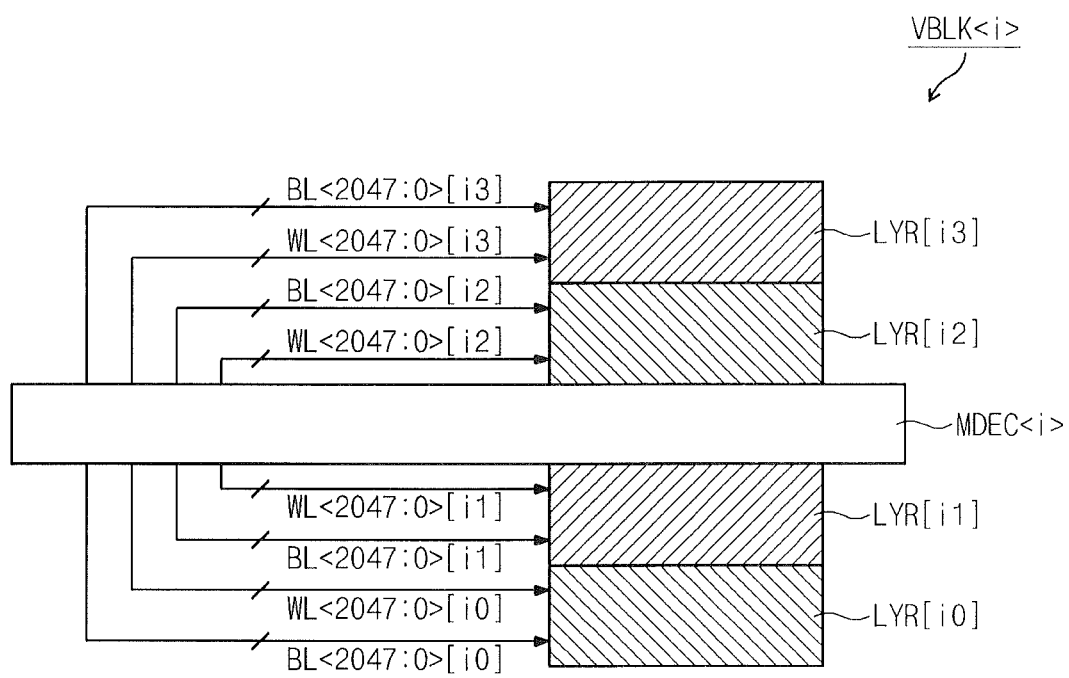
FIG. 9 is a diagram illustrating signals provided to a memory layer according to some embodiments of the inventive concept.

The gates of NMOS transistors TYV0~TYV2047 are connected to the node N12. The ends (a group of sources and drains) of the current paths of the NMOS transistors TYV0~TYV2047 are connected in common to a ground level GND. The other ends (another group of sources and drains) of the current paths of the NMOS transistors TYV0~TYV2047 are connected respectively to the bit lines BL0[ij]~BL2047[ij].

circuits MDEC of the respective vertical blocks. FIG. 9 is a diagram illustrating the above-described signals provided from the selection circuits MDEC of the respective vertical blocks to the respective memory layers. In FIG. 9, '<2047:0>' represents a bus. For example, 'BL<2047:0>' represents bit lines BL0~BL2047.

Figure 10:
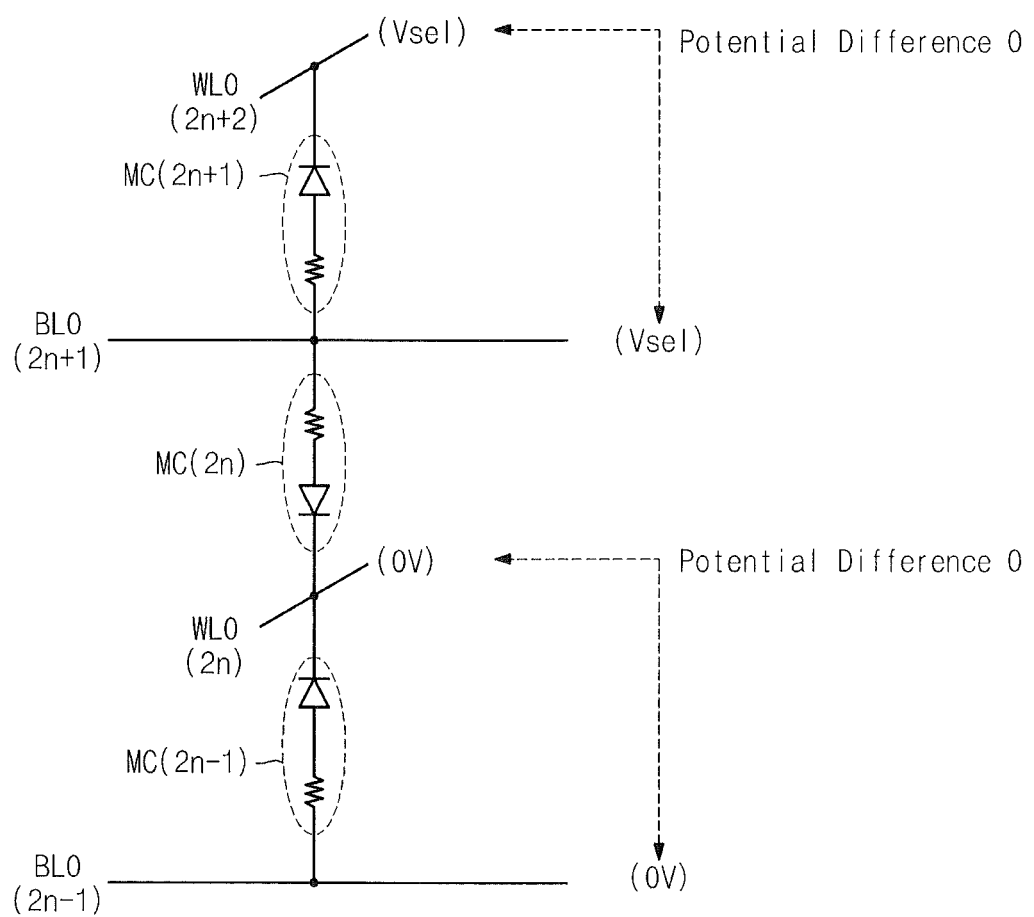
FIG. 10 is a diagram illustrating an operation (bias state) of a nonvolatile memory device according to some embodiments of the inventive concept.

FIG. 10 is a diagram illustrating an operation of the nonvolatile memory device for reading the memory data of the memory cell MC(2n) of the memory layer 2n according to some embodiments of the inventive concept. By the word line selection circuit of FIG. 8, the word line WL0(2n) connected to the read target memory cell MC(2n) in the selected memory layer 2n is driven at a low level 0V (i.e., a ground level GND). The word line WL0(2n+2) connected to the memory cell MC(2n+1) of the memory layer 2n+1 at the upper layer is driven at a high level (i.e., a predetermined voltage level Vsel).

Furthermore, by the bit line preselection circuit and the bit line main selection circuit of FIGS. 6 and 7, the bit line BL0(2n) connected to the memory cell MC(2n) of the selected memory layer 2n is biased at a high level (i.e., a predetermined voltage level Vsel). The bit line BL0(2n−1) connected to the memory cell MC(2n−1) of the memory layer 2n−1 at the lower layer is biased at a low level 0V (i.e., a ground level GND).

By this bias state, the rectifier of the read target memory cell MC(2n) is forward biased and the current corresponding to the resistance value of the resistor is detected by a sense

TABLE 3

| | | | V<i> | VB<i> | L<j> | LB<j> | Selected PBL | Unselected PBL | Selected BL | Unselected BL |
|---|---|---|---|---|---|---|---|---|---|---|
| Selected Bank | Selected Vertical Block | Selected Memory Layer | VHH | GND | VH | GND | Vsel | GND | Vsel | GND |
| | | Unselected Memory Layer | VHH | GND | GND | VH | Vsel | GND | | (all) GND |
| | Unselected Vertical Block | Memory Layer | GND | VHH | GND | VH | Vsel | GND | | (all) GND |
| Unselected Bank | | | VHH or GND | GND or VHH | GND | VH | | (all) GND | | (all) GND |

Table 3 shows the levels of the respective signals of the bit line main selection circuit in accordance with some embodiments of the inventive concept. As illustrated in Table 3, the bit line main selection circuit divides a selected bank and an unselected bank and sets the respective signal values (voltage levels) to bias all the bit lines of the unselected bank at a low level 0V (i.e., a ground level GND). In the selected bank, the bit line main selection circuit divides a selected vertical block and an unselected vertical block and sets the respective signal values (voltage levels) to bias all the bit lines of the unselected vertical block at a low level 0V (i.e., a ground level GND).

In the selected vertical block, the bit line main selection circuit divides a selected memory layer and an unselected memory layer and biases each bit line selectively. In other words, the selected bit lines of the selected memory layer are biased at a high level (i.e., a predetermined voltage level Vsel) and the bit lines of the unselected memory layer are biased at a low level 0V (i.e., a ground level GND). In summary of the operation of the circuit of FIG. 7, the bit line selection circuit biases only the selected bit lines of the selected memory layer at a high level and biases other bit lines at a low level.

Figure 8:
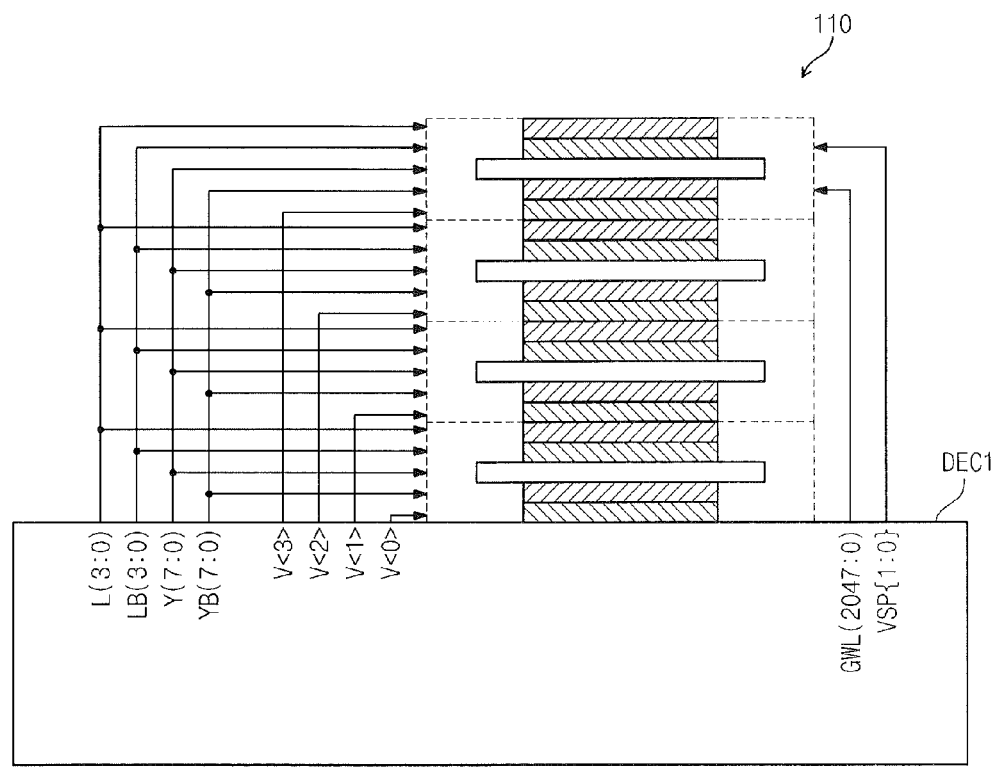
FIG. 8 is a diagram illustrating signals provided to a memory cell array according to some embodiments of the inventive concept.

FIG. 8 is a diagram illustrating the above-described signals provided from the preselection circuit PDEC to the selection amp (not illustrated) through the bit line BL0(2n+1) and is output as data to an external device.

In the memory cell MC(2n+1) at the upper layer of the selected memory layer 2n, the bit line BL0(2n+1) and the word line WL0(2n+2) connected to the memory cell MC(2n+1) are set to the same voltage of a predetermined voltage level Vsel (a potential difference of 0). Thus, the rectifier of the memory cell MC(2n+1) is not forward biased and a leakage current is not generated through the memory cell MC(2n+1).

In the memory cell MC(2n−1) at the lower layer of the selected memory layer 2n, the bit line BL0(2n−1) and the word line WL0(2n) connected to the memory cell MC(2n−1) are set to the same voltage level (a potential difference of 0) of a low level (i.e., a ground level GND). Thus, the rectifier of the memory cell MC(2n−1) is not forward biased and a leakage current is not generated through the memory cell MC(2n−1).

Although not illustrated in FIG. 10, the word lines of other memory layers, which are not adjacent to the selected memory layer (2n), are set to the ground level GND and the bit lines are also set to the ground level GND. Thus, in the memory cells of the memory layers that are not adjacent to the selected memory layer, the word lines and the bit lines are also set to the same voltage level. Accordingly, the selector of the memory cells of the unselected memory layer adjacent to the selected memory layer can be prevented from being forward biased, and a leakage current can be suppressed through the memory cell of each of the unselected memory layers.

As described above, the exemplary embodiments of the inventive concept discussed herein can effectively suppress the power consumption caused by the leakage current of the memory layer and can accurately detect the cell current of the selected cell in a read operation, thus making it possible to stabilize the read operation.

Although the inventive concept has been described with reference to the exemplary embodiments thereof, it will be understood by those of ordinary skill in the art that the inventive concept is not limited to the above-described embodiments and various changes and modifications may be made therein without departing from the scope of the inventive concept. For example, in the above-described embodiment, a 4-layered vertical block structure is used to arrange and stack the selection circuits in the respective blocks. However, configurations of the inventive concept are not limited thereto. The number of memory layers in the vertical block may be greater than or smaller than 4 without departing from the scope of the present inventive concept. All the selection circuits may be integrated at the bottom layer so that only the memory layers are stacked. Although it has been described that the word lines are arranged at the bottom layer, the inventive concept is not limited thereto. As described above, the bit lines may be arranged at the bottom layer. Furthermore, the voltage levels of word lines and bit lines may be set like embodiments discussed above.

In embodiments discussed herein, the rectifier of the selected memory cell is forward biased if the word line is set to the low level and the bit line is set to the high level. However, the inventive concept is not limited thereto. The rectifier of the selected memory cell is forward biased if the word line is set to the high level and the bit line is set to the low level.

In embodiments discussed herein, a diode is used as the rectifier. However, the inventive concept is not limited thereto. The selector may be implemented using any device whose current amount changes according to bias directions. Furthermore, the resistor is used as the memory cell body. However, the inventive concept is not limited thereto. The memory cell body may be implemented using any device whose current amount changes according to memory data. The high level and the low level set in the memory cell are not specifically limited. As described above, the rectifier in the memory cell may also be set to a bias state, to which the inventive concept is not limited.

If the word lines are arranged at the bottom layer, the inventive concept may be expressed as below. It is assumed that the location of each memory layer is defined by a variable Z, the word lines are arranged at the bottom layer, and the bottom memory layer is set to $Z=0$. If the memory layer of $Z=2n$ (n: an integer greater than or equal to 0) is selected, a voltage 0V is applied to all the bit lines of the memory layer of $Z=2n-1$ and a selected voltage Vsel is applied to all the word lines of the memory layer of $Z=2n+1$. If the memory layer of $Z=2n+1$ (n: an integer greater than or equal to 0) is selected, a selected voltage Vsel is applied to all the word lines of the memory layer of $Z=2n+2$ and a voltage 0V is applied to all the bit lines of the memory layer of $Z=2n+2$.

If the bit lines are arranged at the bottom layer, the inventive concept may be expressed as below. It is assumed that the location of each memory layer is defined by a variable Z, the bit lines are arranged at the bottom layer, and the bottom memory layer is set to $Z=0$. If the memory layer of $Z=2n+1$ (n: an integer greater than or equal to 0) is selected, a voltage 0V is applied to all the bit lines of the memory layer of $Z=2n$ and a selected voltage Vsel is applied to all the word lines of the memory layer of $Z=2n+2$. If the memory layer of $Z=2n$ (n: an integer greater than or equal to 0) is selected, a selected voltage Vsel is applied to all the word lines of the memory layer of $Z=2n-1$ and a voltage 0V is applied to all the bit lines of the memory layer of $Z=2n+1$.

Figure 11:
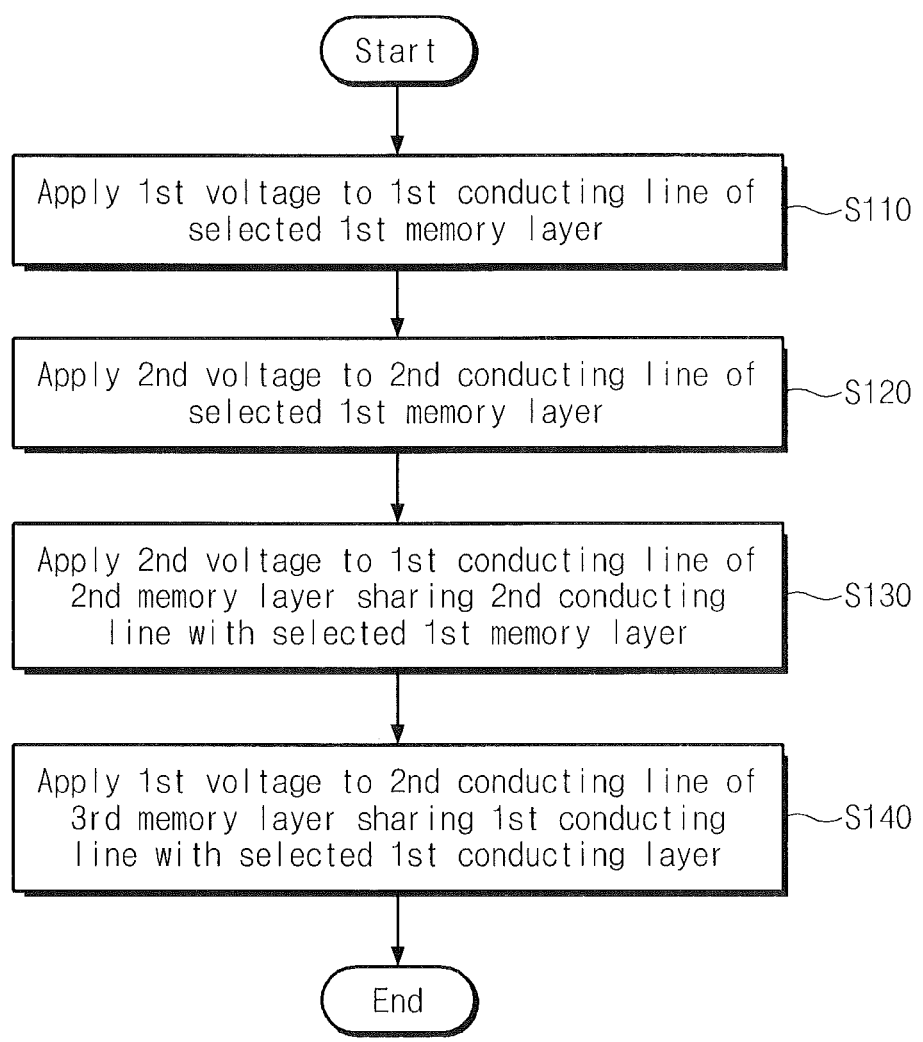
FIG. 11 is a flow chart illustrating operations of a read method of the nonvolatile memory device of FIGS. 1 to 10 in accordance with some embodiments of the inventive concept.

FIG. 11 is a flowchart illustrating operations of a read method of the nonvolatile memory device discussed above with respect to FIGS. 1 to 10 in accordance with some embodiments of the inventive concept discussed herein. Operations begin at block S110 by applying a first voltage to a first conductive line of a selected first memory layer. For example, the first conductive line may be a word line or a bit line and the first voltage may be a voltage with a ground level GND or a positive voltage with a predetermined level Vsel.

A second voltage is applied to a second conductive line of the selected first memory layer (block S120). For example, the second conductive line may be a bit line or a word line and the second voltage may be a positive voltage with a predetermined level Vsel or a voltage with a ground level GND. If operations of blocks S110 and S120 are performed, a selector (e.g., a diode) of a memory cell of the selected memory layer may form a current path.

The second voltage is applied to a first conductive line of a second memory layer sharing the second conductive line with the selected first memory layer (block S130). If operations of block S130 are performed, a leakage current may be prevented as described with reference to FIGS. 1 to 10. Furthermore, a selector (e.g., a diode) of a memory cell of the second memory layer may not form a current path.

The first voltage is applied to a second conductive line of a third memory layer sharing the first conductive line with the selected first memory layer (block S140). If operations of block S140 are performed, a selector (e.g., a diode) of a memory cell of the third memory layer may not form a current path.

If operations of blocks S110 to S140 are performed, a selector of a selected memory cell of the selected memory layer forms a current path. A selector of an unselected memory cell of the unselected memory layer does not form a current path. Furthermore, the generation of a leakage current is prevented in the memory layers adjacent to the selected memory layer.

In embodiments discussed above, various values are used to describe the nonvolatile memory devices according to the embodiments of the inventive concept. For example, it has been described that the memory cell array 100 has 4×4 banks. However, the nonvolatile memory devices according to the exemplary embodiments of the inventive concept are not limited by the above-described values. For example, the memory cell array 100 is not limited to having 4×4 banks. For example, the memory cell array 100 may have 1×1 bank, 2×2 banks, or 8×8 banks. Furthermore, the memory cell array 100 may have 2×4 banks or 4×8 banks.

It will be further understood that each memory bank is not limited to having 4 vertical blocks. Each vertical block is not limited to having 4 memory layers LYR(0)~LYR(3). Each memory layer is not limited to having 2048×2048 memory cells. The nonvolatile memory device is not limited to having 16 I/O terminals. Each memory cell is not limited to storing data 1 or 0. For example, each memory cell may be a multi-level cell (MLC) that stores 2 or more bits per cell.

Figure 12:
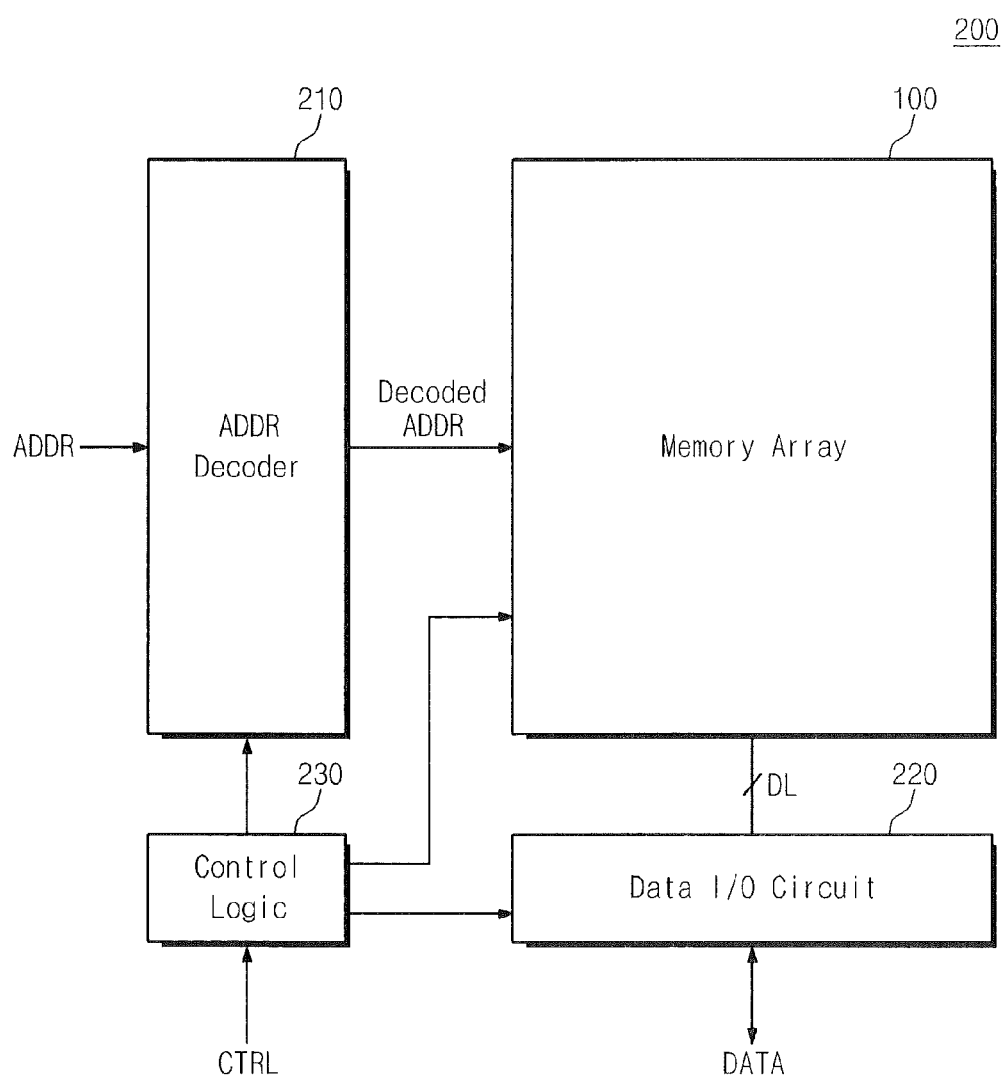
FIG. 12 is a block diagram including the nonvolatile memory device described with reference to FIGS. 1 to 11 in accordance with some embodiments of the present inventive concept.

FIG. 12 is a block diagram of the nonvolatile memory device 200 described with reference to FIGS. 1 to 11. As illustrated in FIG. 12, the nonvolatile memory device 200 includes a memory cell array 100, an address decoder 210, a data input/output (I/O) circuit 220, and control logic 230. The memory cell array 100 is configured similar to embodiments discussed above with respect to FIGS. 1 to 11.

The address decoder 210 is configured to operate in response to the control of the control logic 150. The address decoder 210 receives an address ADDR from an external device. The address decoder 210 is configured to decode the received address ADDR. The decoded address is transferred to the memory cell array 100.

The data I/O circuit 220 is connected through data lines DL to the memory cell array 100. The data I/O circuit 220 operates in response to the control of the control logic 230. The data I/O circuit 220 is configured to exchange data (DATA) with an external device. The data I/O circuit 220 is configured to transfer data (DATA), received from the external device, through the data lines DL to the memory cell array 100. The data I/O circuit 220 is configured to transfer data (DATA), received through the data lines DL from the memory cell array 100, to the external device. For example, the data I/O circuit 220 includes well-known components such as data buffers.

The control logic 230 is connected to the memory cell array 100, the address decoder 210, and the data I/O circuit 220. The control logic 230 is configured to control an overall operation of the nonvolatile memory device 200. The control logic 230 operates in response to a control signal CTRL received from an external device.

As discussed above with respect to FIGS. 1 to 11, a leakage current of a memory layer adjacent to a selected memory layer is prevented in a read operation of the nonvolatile memory device 200, thus reducing the power consumption of the nonvolatile memory device 200.

Figure 13:
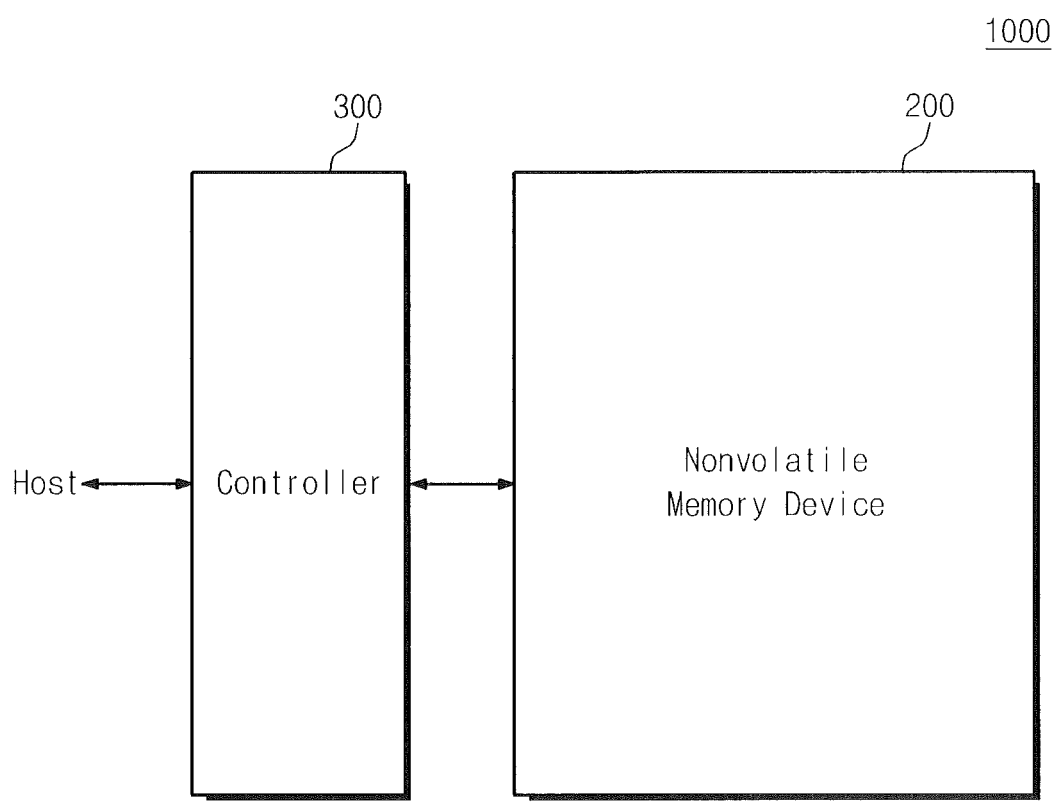
FIG. 13 is a block diagram of a memory system including the nonvolatile memory device of FIG. 12 in accordance with some embodiments of the inventive concept.

FIG. 13 is a block diagram of a memory system 1000 including the nonvolatile memory device 200 of FIG. 12. As illustrated in FIG. 13, the memory system 1000 includes a nonvolatile memory device 200 and a controller 300. The controller 300 is connected to a host and the nonvolatile memory device 200. The controller 300 is configured to access the nonvolatile memory device 200 in response to a request from the host. For example, the controller 300 is configured to control a read/write/erase operation of the nonvolatile memory device 200 in response to a request from the host. The controller 300 is configured to control a background operation of the nonvolatile memory device 200. The controller 300 is configured to provide an interface between the nonvolatile memory device 200 and the host. The controller 300 is configured to drive firmware for controlling the nonvolatile memory device 200.

The controller 300 may be configured to provide a control signal CTRL and an address ADDR to the nonvolatile memory device 200. Furthermore, the controller 300 is configured to exchange data (DATA) with the nonvolatile memory device 200.

The controller 300 may further include a random access memory (RAM), a processing unit, a host interface, and a memory interface. The RAM may be used as at least one of a working memory of the processing unit, a cache memory between the nonvolatile memory device 200 and the host, and a buffer memory between the nonvolatile memory device 200 and the host. The processing unit controls an overall operation of the controller 300.

The host interface includes a protocol for data exchange between the host and the controller 300. As an example, the controller 300 is configured to communicate with an external device (e.g., the host) through one of various interface protocols such as Universal Serial Bus (USB), Multimedia Card (MMC), Peripheral Component Interconnection(PCI), PCI-Express(PCI-E), Advanced Technology Attachment (ATA), Serial-ATA, Parallel-ATA, Small Computer Small Interface (SCSI), Enhanced Small Disk Interface(ESDI), and Integrated Drive Electronics(IDE). The memory interface is configured to interface with the nonvolatile memory device 200. For example, the memory interface includes a NAND interface or a NOR interface.

The memory system 1000 may further include an error correction block. The error correction block is configured to use an error correction code (ECC) to detect/correct an error in data read from the nonvolatile memory device 200. As an example, the error correction block is provided as a component of the controller 300. The error correction block may be provided as a component of the nonvolatile memory device 200.

The controller 300 and the nonvolatile memory device 200 may be integrated into one semiconductor device. For example, the controller 300 and the nonvolatile memory device 200 are integrated into one semiconductor device to constitute a memory card. For example, the controller 300 and the nonvolatile memory device 200 are integrated into one semiconductor device to constitute a memory card such as a PC card (e.g., Personal Computer Memory Card International Association(PCMCIA)), a compact flash card (CF), a smart media card (SM/SMC), a memory stick, a multimedia card (e.g., MMC, RS-MMC and MMCmicro), a SD card (e.g., SD, miniSD, microSD and SDHC), and a universal flash storage (UFS).

The controller 300 and the nonvolatile memory device 200 are integrated into one semiconductor device to constitute a solid state drive (SSD). The SSD includes a storage device that is configured to store data in a semiconductor memory. When the memory system 1000 is used as an SSD, the operation speed of the host connected to the memory system 1000 increases remarkably.

Furthermore, the memory system 1000 is provided as one of various components of electronic devices such as computers, Ultra Mobile PCs(UMPCs), workstations, net-books, PDAs, portable computers, web tablets, wireless phones, mobile phones, smart phones, e-books, Portable Multimedia Players(PMPs), portable games, navigation devices, black boxes, digital cameras, Digital Multimedia Broadcasting (DMB) players, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, RFID devices, and one of various components constituting a computing system.

For example, the nonvolatile memory device 200 or the memory system 1000 may be mounted in various types of packages. Examples of the packages of the nonvolatile memory device 200 or the memory system 1000 include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As discussed above with respect to FIGS. 1 to 12, a leakage current of a memory layer adjacent to a selected memory layer may be prevented in the nonvolatile memory device 200 of the memory system 1000, thus reducing the power consumption of the memory system 1000.

Figure 14:
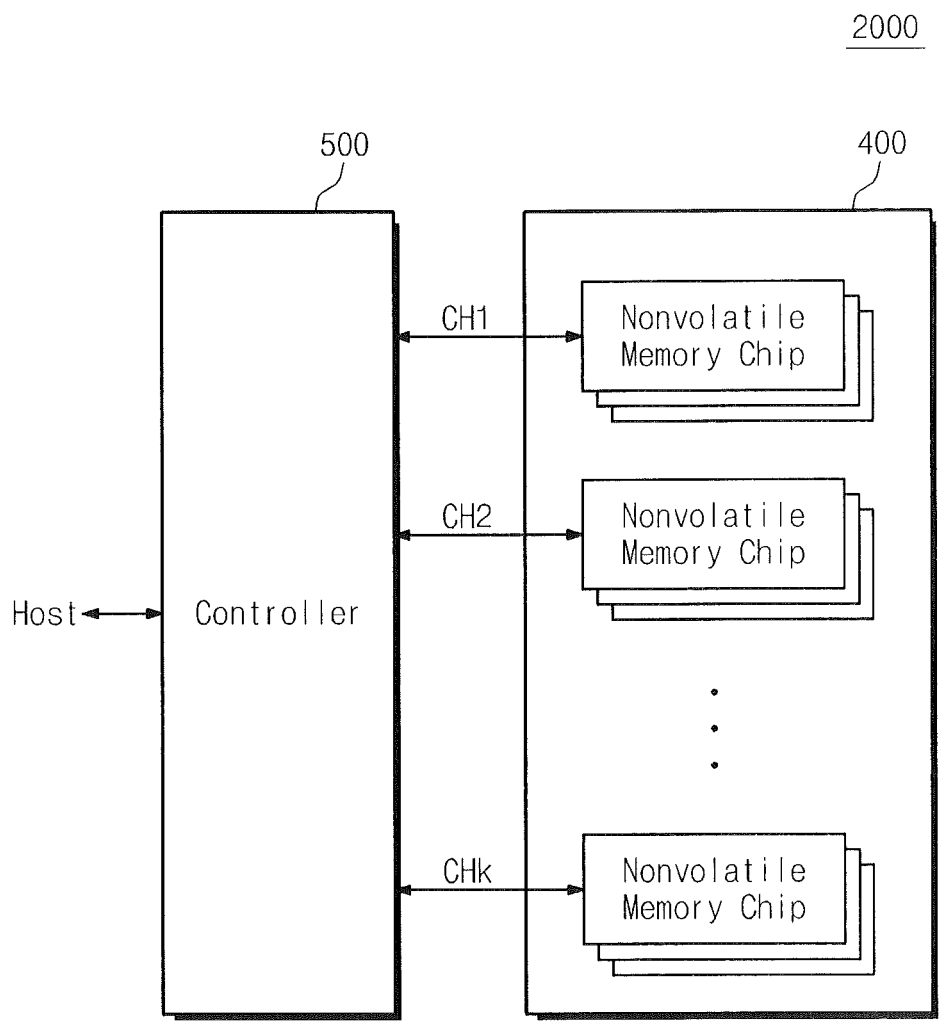
FIG. 14 is a block diagram illustrating an exemplary application of the memory system of FIG. 13 in accordance with some embodiment of the inventive concept.

Referring now to FIG. 14, a block diagram illustrating an exemplary application 2000 of the memory system 1000 of FIG. 13 will be discussed. As illustrated in FIG. 14, the memory system 2000 includes a nonvolatile memory device 400 and a controller 500. The nonvolatile memory device 400 includes a plurality of nonvolatile memory chips. The nonvolatile memory chips are divided into a plurality of groups. Each of the nonvolatile memory chip groups is configured to communicate with the controller 500 through one common channel. FIG. 14 illustrates that the nonvolatile memory chips communicate with the controller 500 through first to k$^{th}$ channels CH1~CHk. Each of the nonvolatile memory chips is configured in the same way as the nonvolatile memory device 200 described with reference to FIGS. 1 to 12.

As discussed above with respect to FIGS. 1 through 12, a leakage current of a memory layer adjacent to a selected memory layer may be prevented in the nonvolatile memory device 400 of the memory system 2000, thus reducing the power consumption of the memory system 2000.

Figure 15:
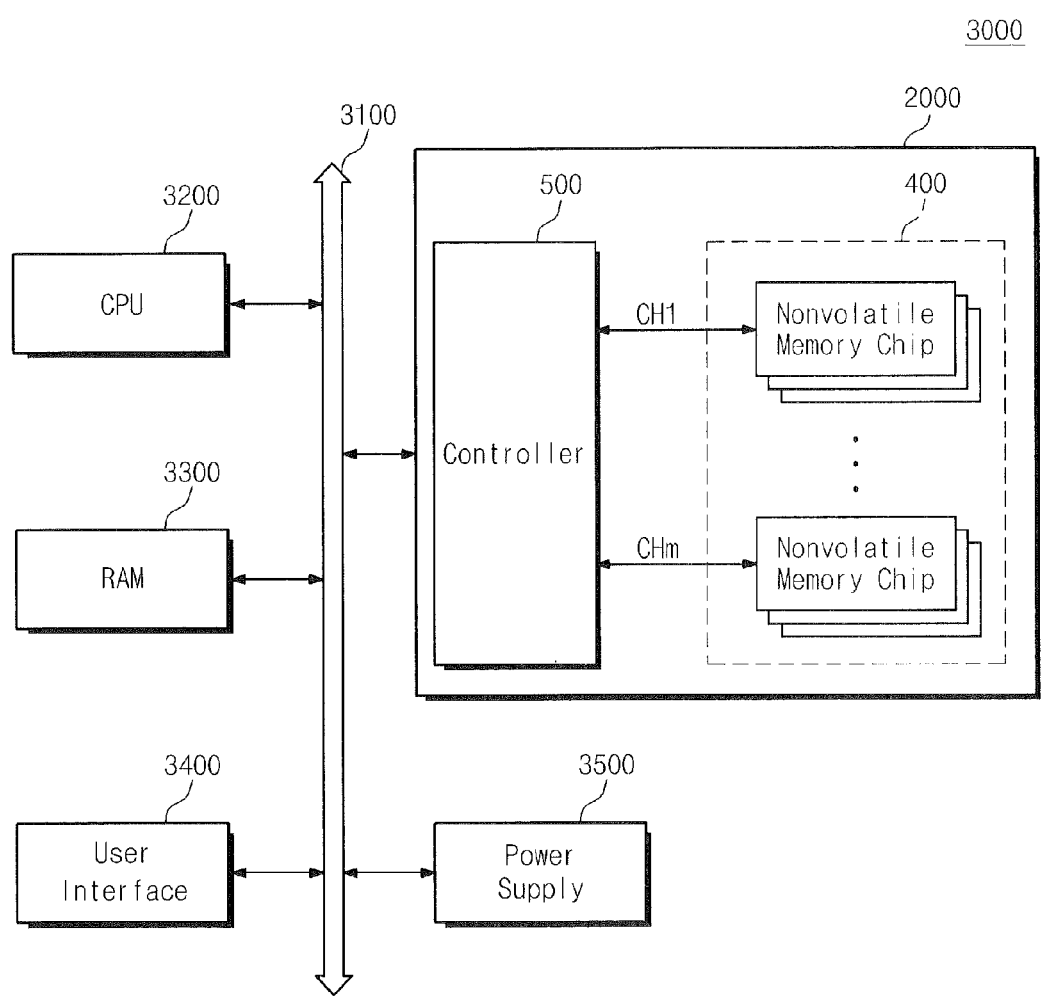
FIG. 15 is a block diagram of a computing system including the memory system described with reference to FIG. 14 in accordance with some embodiments of the inventive concept.
Figure 16:
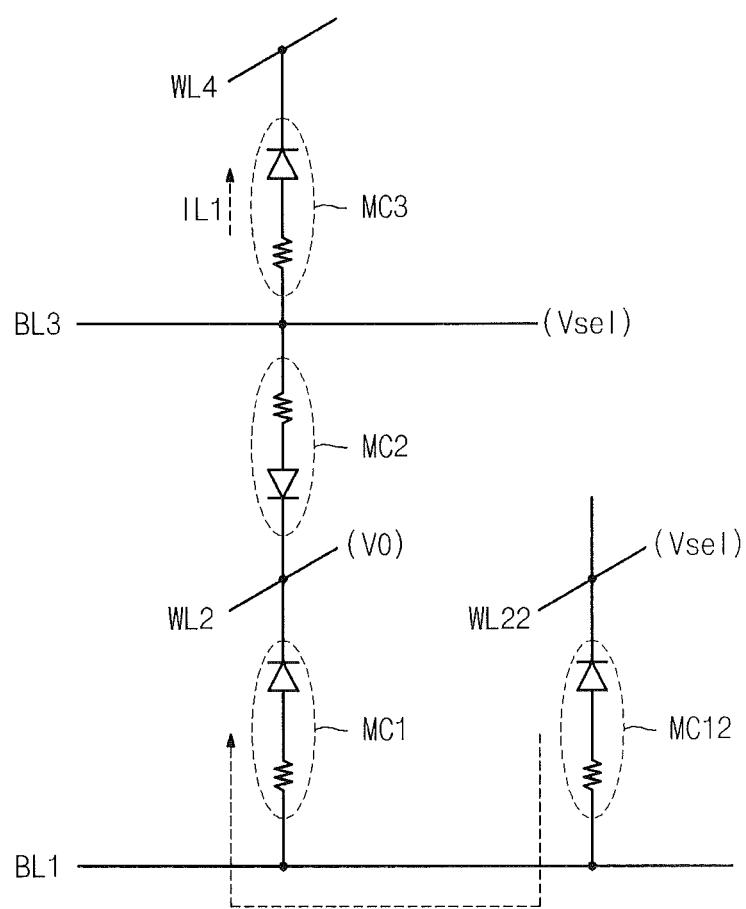
FIG. 16 is a circuit diagram illustrating an equivalent circuit of a conventional memory cell array that uses diodes as selectors of stacked memory cells.

Referring now to FIG. 15, a block diagram of a computing system 3000 including the memory system 2000 described with reference to FIG. 14 will be discussed. As illustrated in FIG. 15, the computing system 3000 includes a central processing unit (CPU) 3200, a random access memory (RAM) 3300, a user interface 3400, a power supply unit 3500, and a memory system 2000.

The memory system 2000 is electrically connected through a system bus 3100 to the CPU 3200, the RAM 3300, the user interface 3400 and the power supply unit 3500. Data, provided through the user interface 3400 or processed by the CPU 3200, are stored in the memory system 2000. The memory system 2000 includes a controller 500 and a nonvolatile memory device 400.

As illustrated in FIG. 15, the nonvolatile memory device 400 is connected through the controller 500 to the system bus 3100. However, the nonvolatile memory device 400 may be connected directly to the system bus 3100 without departing from the scope of the present inventive concept.

Similarly, although FIG. 15 illustrates that the computing system 3000 includes the memory system 2000 described with reference to FIG. 14, the memory system 2000 may be replaced with the memory system 1000 discussed with respect to FIG. 13 without departing from the scope of the present inventive concept.

For example, the computing system 3000 may include both of the memory systems 1000 and 2000 discussed above with respect to FIGS. 13 and 14.

As discussed above with respect to FIGS. 13 and 14, the use of some embodiments of the inventive concept may reduce the power consumption of the memory system 1000 or 2000, thus possibly reducing the power consumption of the computing system 3000.

As further discussed above, the present inventive concept can stably detect the current of a read target memory cell while suppressing the power consumption of unselected memory cells in a read operation.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A nonvolatile memory device including a memory cell array having a plurality of stacked memory layers and a rectifier configured to select memory cells constituting each memory layer sharing one of a word line and a bit line, but not both, with another adjacent memory layer, the nonvolatile memory device comprising:
    a word line driving unit configured to drive a first word line, connected to a first memory cell of a first memory layer to be read, at a first voltage level and drive a second word line, connected to a second memory cell of a second memory layer sharing a first bit line connected to the first memory cell, at a second voltage level; and
    a bit line biasing unit configured to bias the first bit line at the second voltage level and bias a second bit line, connected to a third memory cell of a third memory layer sharing the first word line, at the first voltage level,
    wherein the first and second word lines have a first direction, the first and second bit lines have a second direction intersecting the first direction, and the memory layers are stacked along a third direction intersecting the first and second directions.

2. The nonvolatile memory device of claim 1:
    wherein the memory cell array comprises a plurality of blocks each including a plurality of memory layers; and
    wherein the word line driving unit is further configured to float all word lines of other blocks among the plurality of blocks, except a block of the plurality of blocks that includes the first memory layer to be read.

3. The nonvolatile memory device of claim 2, wherein the bit line biasing unit is further configured to bias all bit lines except the first bit line connected to the memory cell of the first memory layer to be read, at the first voltage level.

4. The nonvolatile memory device of claim 1, wherein the rectifier is a diode.

5. The nonvolatile memory device of claim 4, wherein the first voltage level and the second voltage level forward-bias the diode provided as a selector of the first memory cell of the first memory layer to be read.

6. The nonvolatile memory device of claim 1, wherein the second voltage level is higher than the first voltage level.

7. A method of reading in a nonvolatile memory device, the nonvolatile memory device including a memory cell array having a plurality of stacked memory layers each having a first conductive line having a first direction, a second conductive line having a second direction intersecting the first direction, and a memory cell at an intersection between the first conductive line and the second conductive line, and sharing one of the first and second conductive line, but not both, with an adjacent memory layer, the method of reading comprising:
    selecting a first memory layer;
    applying a first voltage to a first conductive line of the selected first memory layer;
    applying a second voltage to a second conductive line of the selected first memory layer; and
    applying the second voltage to a first conductive line of a second memory layer sharing the second conductive line with the selected first memory layer,
    wherein the memory layers are stacked along a third direction intersecting the first and second directions.

8. The method of claim 7, wherein the second voltage is higher than the first voltage.

9. The method of claim 7:
wherein the memory cell includes a diode; and
wherein the second voltage and the first voltage forward-bias the diode.

10. The method of claim 7, further comprising applying the first voltage to a second conductive line of a third memory layer sharing the first conductive line with the selected first memory layer.

11. The method of claim 7, wherein the plurality of stacked memory layers are divided into a plurality of memory blocks, the method further comprising:
floating word lines of an unselected memory block.

12. A memory system comprising:
a nonvolatile memory device; and
a controller configured to control the nonvolatile memory device,
wherein the nonvolatile memory device comprises:
a memory cell array including a plurality of stacked memory layers each having a first conductive line having a first direction, a second conductive line having a second direction, different from and intersecting the first direction, and a memory cell at the intersection between the first conductive line and the second conductive line, and sharing one of the first and second conductive lines, but not both, with an adjacent memory layer;
a first selection circuit configured to apply a first voltage to a first conductive line of a selected first memory layer and apply a second voltage to a first conductive line of a second memory layer sharing the second conductive line with the selected first memory layer; and
a second selection circuit configured to apply the second voltage to a second conductive line of the selected first memory layer,
wherein the memory layers are stacked along a third direction intersecting the first and second directions.

13. The system of claim 12, wherein the second selection circuit is further configured to apply the first voltage to a second conductive line of a third memory layer sharing the first conductive line with the selected first memory layer.

14. The system of claim 12, wherein the first voltage is a ground voltage and the second voltage is a positive voltage.

15. The system of claim 12, wherein the nonvolatile memory device and the controller constitute a memory card.

16. The system of claim 12, wherein the nonvolatile memory device and the controller constitute a solid state drive.

* * * * *